US012581896B2

(12) United States Patent
Nguyen et al.

(10) Patent No.: US 12,581,896 B2
(45) Date of Patent: Mar. 17, 2026

(54) EXTERNAL SUBSTRATE SYSTEM ROTATION IN A SEMICONDUCTOR PROCESSING SYSTEM

(71) Applicant: Applied Materials, Inc., Santa Clara, CA (US)

(72) Inventors: Tuan Anh Nguyen, San Jose, CA (US); Amit Kumar Bansal, Milpitas, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 571 days.

(21) Appl. No.: 18/101,995

(22) Filed: Jan. 26, 2023

(65) Prior Publication Data

US 2023/0162999 A1     May 25, 2023

Related U.S. Application Data

(60) Continuation of application No. 16/588,959, filed on Sep. 30, 2019, now Pat. No. 11,574,825, which is a
(Continued)

(51) Int. Cl.
*H01L 21/67* (2006.01)
*H01L 21/02* (2006.01)
(Continued)

(52) U.S. Cl.
CPC .... *H01L 21/67184* (2013.01); *H01L 21/0226* (2013.01); *H01L 21/681* (2013.01);
(Continued)

(58) Field of Classification Search
CPC ........... H01L 1/67167; H01L 21/67155; H01L 21/67161
See application file for complete search history.

(56) References Cited

U.S. PATENT DOCUMENTS

| | | | |
|---|---|---|---|
| 5,135,349 A | 8/1992 | Lorenz et al. | |
| 6,952,491 B2 | 10/2005 | Alumot et al. | |
(Continued)

FOREIGN PATENT DOCUMENTS

| | | |
|---|---|---|
| CN | 101562124 A | 10/2009 |
| CN | 103493180 A | 1/2014 |
(Continued)

OTHER PUBLICATIONS

Office Action for Taiwan Application No. 105110319 dated Jan. 3, 2019.
(Continued)

*Primary Examiner* — James M Mellott
(74) *Attorney, Agent, or Firm* — Patterson + Sheridan, LLP

(57) ABSTRACT
A method and apparatus for processing a semiconductor is disclosed herein. In one embodiment, a processing system for semiconductor processing is disclosed. The processing chamber includes two transfer chambers, a processing chamber, and a rotation module. The processing chamber is coupled to the transfer chamber. The rotation module is positioned between the transfer chambers. The rotation module is configured to rotate the substrate. The transfer chambers are configured to transfer the substrate between the processing chamber and the transfer chamber. In another embodiment, a method for processing a substrate on the apparatus is disclosed herein.

18 Claims, 9 Drawing Sheets

Related U.S. Application Data division of application No. 15/091,260, filed on Apr. 5, 2016, now Pat. No. 10,431,480.

(60) Provisional application No. 62/151,799, filed on Apr. 23, 2015.

(51) Int. Cl.
   *H01L 21/66*      (2006.01)
   *H01L 21/68*      (2006.01)
   *H01L 21/687*     (2006.01)

(52) U.S. Cl.
   CPC .. *H01L 21/68742* (2013.01); *H01L 21/68792* (2013.01); *H01L 21/67173* (2013.01); *H01L 22/12* (2013.01)

(56)                References Cited

U.S. PATENT DOCUMENTS

| | | | |
|---|---|---|---|
| 2001/0050059 A1* | 12/2001 | Hongo | H01J 37/32192 118/723 MW |
| 2004/0043557 A1* | 3/2004 | Haukka | H01L 21/02189 438/785 |
| 2004/0151562 A1 | 8/2004 | Hofmeister et al. | |
| 2005/0111938 A1 | 5/2005 | Meulen | |
| 2005/0120578 A1 | 6/2005 | van der Meulen | |
| 2007/0134821 A1 | 6/2007 | Thakur et al. | |
| 2008/0041716 A1* | 2/2008 | Alpay | G03F 1/26 204/192.2 |
| 2008/0117413 A1 | 5/2008 | Liphardt et al. | |
| 2008/0171435 A1 | 7/2008 | Fujii et al. | |
| 2008/0175693 A1 | 7/2008 | Fujii | |
| 2008/0219812 A1* | 9/2008 | van der Meulen | H01L 21/67184 414/217 |
| 2009/0263230 A1 | 10/2009 | Hwang | |
| 2010/0227059 A1 | 9/2010 | Kato et al. | |
| 2012/0266819 A1 | 10/2012 | Sanchez et al. | |
| 2015/0235815 A1 | 8/2015 | Gomi et al. | |
| 2015/0262859 A1 | 9/2015 | Balasubramanian et al. | |
| 2016/0133489 A1 | 5/2016 | Janakiraman et al. | |

FOREIGN PATENT DOCUMENTS

| | | | |
|---|---|---|---|
| JP | 2002-124478 | A | 4/2002 |
| JP | 2002-148011 | A | 5/2002 |
| JP | 2002-324829 | A | 11/2002 |
| JP | 2005-259902 | A | 9/2005 |
| JP | 2005-328081 | A | 11/2005 |
| JP | 2007019068 | A | 1/2007 |
| JP | 2009-543355 | A | 12/2009 |
| JP | 2010-206025 | A | 9/2010 |
| KR | 1998-0029384 | A | 7/1998 |
| KR | 101228728 | B1 | 2/2013 |
| WO | 2006137476 | A1 | 12/2006 |
| WO | 2008005773 | A2 | 1/2008 |
| WO | 2014006804 | | 1/2014 |
| WO | 2014006804 | A1 | 1/2014 |

OTHER PUBLICATIONS

Office Action for Chinese Application No. 201610248104.3 dated Jun. 19, 2020.
Search Report for Chinese Application No. 201610248104.3 dated Jun. 11, 2020.
Office Action for Japanese Application No. 2016-084118 dated Jun. 23, 2020.
Japanese Office Action for Japanese Application No. 2016-084118 dated Feb. 9, 2021.
Chinese Office Action and Search Report for Chinese Application No. 201610248104.3 dated Mar. 15, 2021.
Korean Office Action for Korean Application No. 10-2016-0049510, dated Sep. 23, 2022.
JP Office Action for Japanese Application No. 2016-084118 dated Feb. 9, 2021.
CN Office Action and Search Report for Chinese Application No. 201610248104.3 dated Mar. 15, 2021.
JP Office Action for Japanese Application No. 2023-147337 dated Oct. 22, 2024.
Office Action issued to Chinese Application No. 202110890839.7 on Jan. 1, 2025 in 20 pages.
Korean Office Action for Korean Application No. 10-2023-0073432, dated Feb. 12, 2024.
Japanese Office Action for Japanese Application No. 2021-172093, dated Jan. 17, 2023.
Korean Office Action dated Mar. 18, 2025 for Application No. 10-2024-0130551.

* cited by examiner

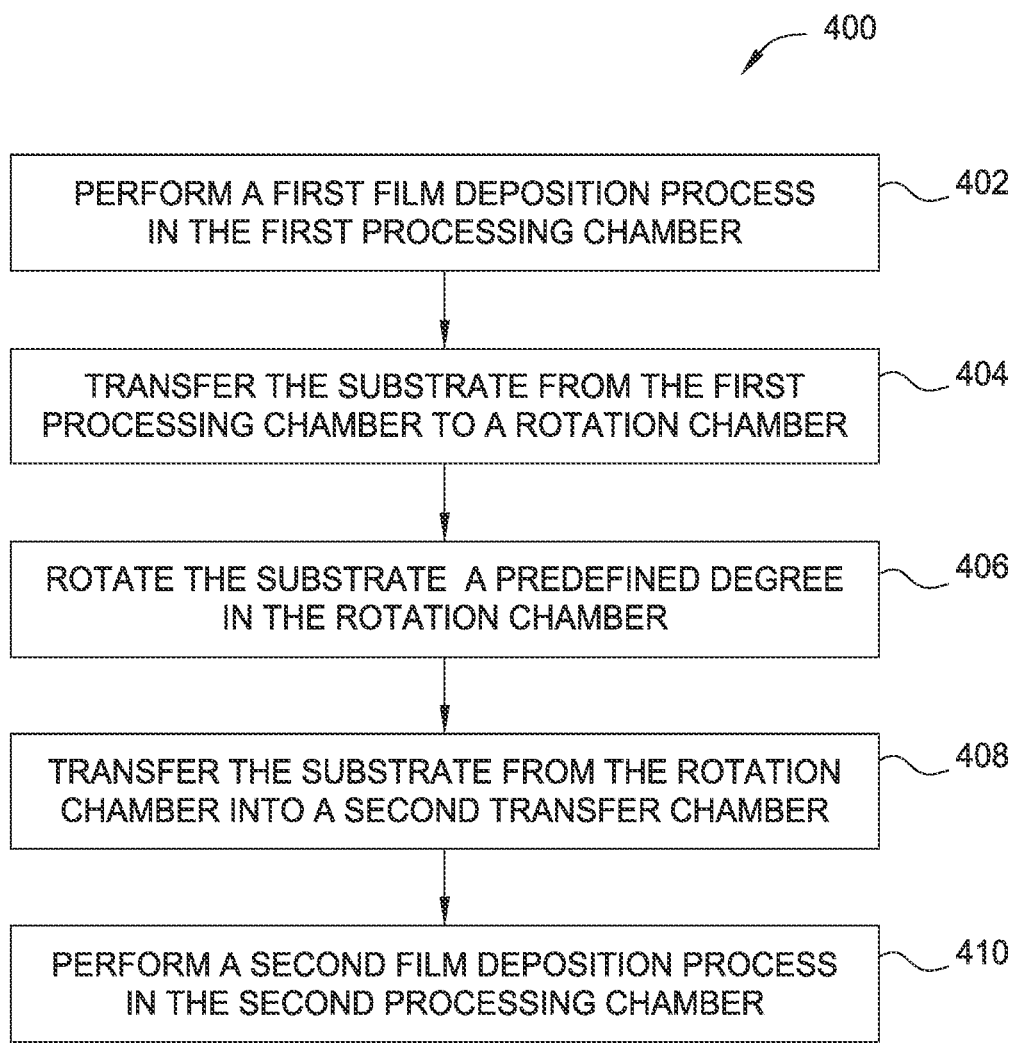

400

PERFORM A FIRST FILM DEPOSITION PROCESS IN THE FIRST PROCESSING CHAMBER — 402

TRANSFER THE SUBSTRATE FROM THE FIRST PROCESSING CHAMBER TO A ROTATION CHAMBER — 404

ROTATE THE SUBSTRATE A PREDEFINED DEGREE IN THE ROTATION CHAMBER — 406

TRANSFER THE SUBSTRATE FROM THE ROTATION CHAMBER INTO A SECOND TRANSFER CHAMBER — 408

PERFORM A SECOND FILM DEPOSITION PROCESS IN THE SECOND PROCESSING CHAMBER — 410

FIG. 4

EXTERNAL SUBSTRATE SYSTEM ROTATION IN A SEMICONDUCTOR PROCESSING SYSTEM

CROSS-REFERENCE TO RELATED APPLICATIONS

This application is a continuation of U.S. patent application Ser. No. 16/588,959, filed Sep. 30, 2019, which is a divisional of U.S. patent application Ser. No. 15/091,260, filed Apr. 5, 2016, which claims priority to U.S. Provisional Application No. 62/151,799, filed Apr. 23, 2015, each of which are hereby incorporated by reference in their entireties.

FIELD

The present disclosure generally relates to a method and apparatus for film uniformity in semiconductor processing. More specifically, a processing system having a rotation module coupled between two transfer chambers to increase film uniformity in semiconductor processing.

BACKGROUND

Semiconductive device performance is determined by a variety of factors. One factor of importance is the uniformity of films deposited on a substrate. It is desirable to deposit films uniformly such that thickness variation is minimized across the surface of the substrate. For example, it may be desirable to form films having thickness variation of less than about 5% across the surface of the substrate.

However, film uniformity may be adversely affected by several factors, including heater temperature, chamber geometry, process gas flow non-uniformity, and plasma non-uniformity, among others. These factors may result in the deposition of non-uniform films on the surface of the substrate, which may ultimately reduce device performance.

Rotating the substrate during processing provides improved uniformity. However, rotating the substrate during processing requires expensive equipment, such as slip rings and rotary unions.

Therefore, there is a need for an improved apparatus and method for film uniformity in semiconductor processing.

SUMMARY

In one embodiment, a method for processing a substrate is provided, the method including depositing a first portion of a film on the substrate in a processing chamber, transferring the substrate to a rotation module, rotating the substrate a predefined amount, transferring the substrate to the processing chamber, and depositing a second portion of the film on the substrate in the processing chamber.

In another embodiment, a method for processing a substrate is provided, the method including depositing a first portion of a film on the substrate in a first processing chamber, transferring the substrate to a rotation module, rotating the substrate a predefined amount, transferring the substrate to a second processing chamber, and depositing a second portion of the film on the substrate in the second processing chamber. The depositing a first portion and the depositing a second portion include the same deposition process.

In yet another embodiment, a processing chamber for semiconductor processing configured to be coupled between two transfer chambers is provided, the processing chamber including a chamber body defining an interior volume having an opening at a first and a second end, a substrate support, and a rotation module. The substrate support includes a substrate platform. The substrate support extends beyond the opening at the first end and the second end of the chamber body. The substrate support is configured to rotate a substrate. The rotation module includes a measurement module. The measurement module includes an ellipsometer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 illustrates a method of processing a substrate, according to one embodiment.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
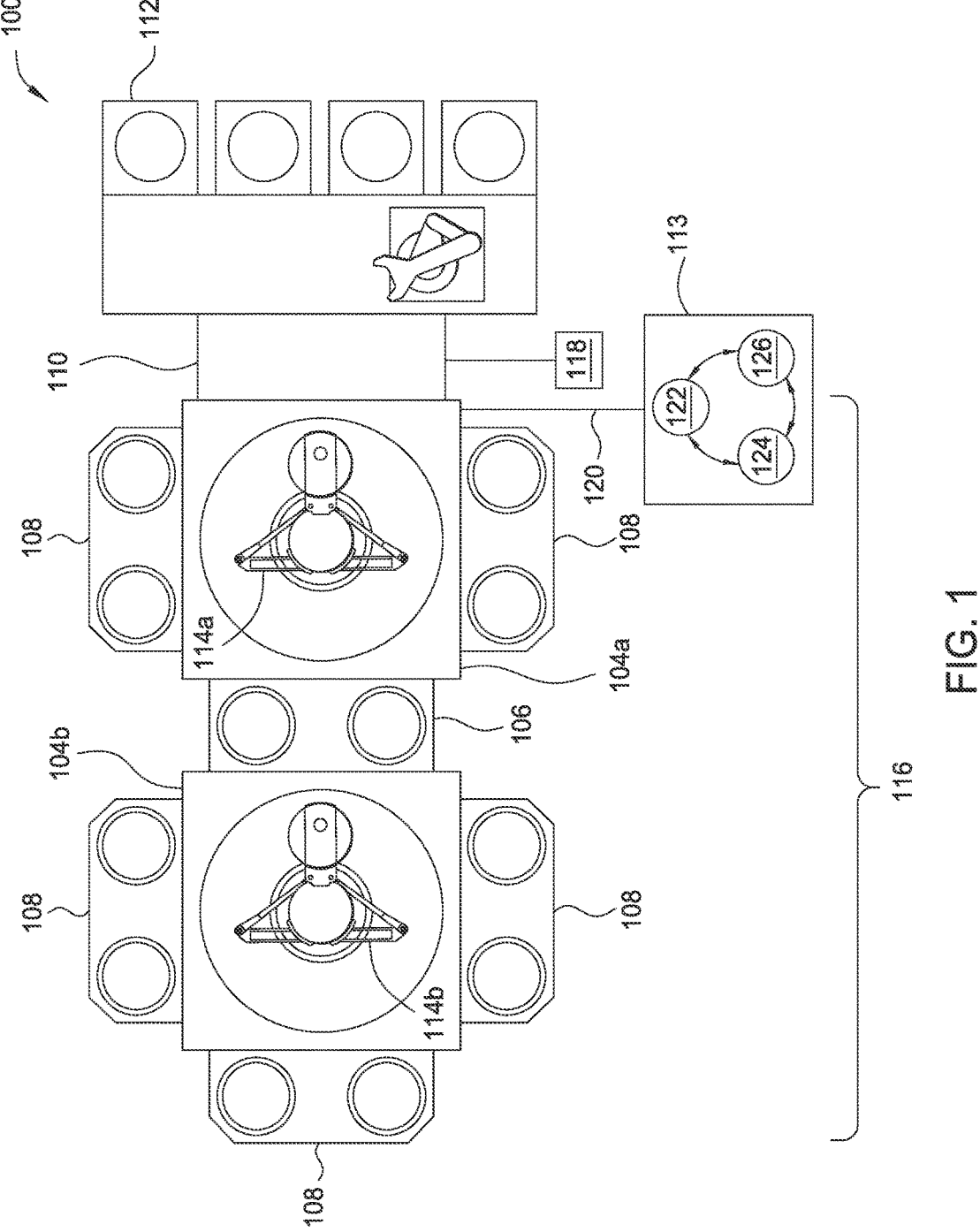
FIG. 1 illustrates a top view of a processing system that includes at least one rotation module according to one embodiment.

FIG. 1 illustrates a schematic view of a processing system 100 for processing a substrate (not shown). The processing system 100 includes two transfer chambers 104a, 104b, a rotation module 106, and one or more processing chambers 108. The processing system 100 may also include a load lock chamber 110, a factory interface 112, and a controller 113. The factory interface 112 is configured to load and unload substrates from the processing system 100. The factory interface 112 may include various robots and load ports adapted to load substrates to be processed and to store substrates that have been processed.

The load lock chamber 110 couples the transfer chamber 104a to the factory interface 112. The load lock chamber 110 is selectively in fluid communication with transfer chamber 104a, such that a substrate may be transferred between the atmospheric environment of the factory interface 112 and the load lock chamber 110. Transfer chamber 104a includes a robot 114a. The robot 114a is configured to transfer the substrates into and out of chambers 106, 108. Transfer chamber 104b includes a robot 114b. The robot 114b is configured to transfer the substrates into and out of chambers 106, 108.

The processing chambers 108 are coupled to the transfer chambers 104a, 104b. In one embodiment, the processing chambers 108 may be a deposition chamber or a treatment chamber. Examples of suitable deposition chambers include, but are not limited to, a chemical vapor deposition (CVD) chamber, a spin-on coating chamber, a flowable CVD chamber, a physical vapor deposition (PVD) chamber, an atomic layer deposition (ALD) chamber, an epitaxial deposition chamber, and the like. Examples of treatment chambers include, but are not limited to, a thermal treatment chamber, an annealing chamber, a rapid thermal anneal chamber, a laser treatment chamber, an electron beam treatment chamber, a UV treatment chamber, an ion beam implantation chamber, an ion immersion implantation chamber, or the like. It is also contemplated that one or more of the processing chambers 108 may be another type of vacuum processing chamber.

The rotation module 106 is coupled to the transfer chambers 104a, 104b. The rotation module 106 separates transfer chamber 104a from transfer chamber 104b. The rotation module 106 allows for fluid communication between transfer chambers 104a, 104b, such that a substrate being transferred from 104a to 104b passes through the rotation module 106. The rotation module 106 is configured to rotate a substrate. The rotation module 106 is discussed in more detail in FIG. 2.

Continuing to refer to FIG. 1, the processing chambers 108, the rotation module 106, the transfer chambers 104a, 104b, and the load lock chamber 110 are connected to form a vacuum tight platform 116. One or more pump systems 118 are coupled to the load lock chamber 110, the transfer chambers 104a, 104b, the rotation module 106, and the processing chambers 108. In FIG. 1, a single pump system 118 is shown coupled to the load lock chamber 110 to avoid drawing clutter. The pump system 118 controls the pressure within the processing system 100. The pump system 118 may be utilized to pump down and vent the load lock chamber 110 as needed to facilitate entry and removal of substrates from the vacuum tight platform 116.

The processing system 100 is coupled to the controller 113 by a communication cable 120. The controller 113 is operable to control processing of a substrate within the processing system 100. The controller 113 includes a programmable central processing unit (CPU) 122 that is operable with a memory 124 and a mass storage device, an input control unit, and a display unit (not shown), such as power supplies, clocks, cache, input/output (I/O) circuits, and the like, coupled to the various components of the processing system 100 to facilitate control of the processes of processing a substrate. The controller 113 may also include hardware for monitoring the processing of a substrate through sensors (not shown) in the processing system 100.

To facilitate control of the processing system 100 and processing a substrate, the CPU 122 may be one of any form of general purpose computer processors for controlling the substrate process. The memory 124 is coupled to the CPU 122 and the memory 124 is non-transitory and may be one or more of readily available memory such as random access memory (RAM), read only memory (ROM), floppy disk drive, hard disk, or any other form of digital storage, local or remote. Support circuits 126 are coupled to the CPU 122 for supporting the CPU 122 in a conventional manner. The process for processing a substrate is generally stored in the memory 124. The process for processing a substrate may also be stored and/or executed by a second CPU (not shown) that is remotely located from the hardware being controlled by the CPU 122.

The memory 124 is in the form of computer-readable storage media that contains instructions, that when executed by the CPU 122, facilitates the operation of processing a substrate in the processing system 100. The instructions in the memory 124 are in the form of a program product such as a program that implements the operation of processing a substrate. The program code may conform to any one of a number of different programming languages. In one example, the disclosure may be implemented as a program product stored in computer readable storage media for use with a computer system. The program(s) of the program product define functions of the embodiments. Illustrative computer-readable storage media include, but are not limited to: (i) non-writable storage media (e.g., read-only memory devices within a computer such as CD-ROM disks readable by a CD-ROM drive, flash memory, ROM chips or any tope of solid-state non-volatile semiconductor memory) on which information is permanently stored; and (ii) writing storage media (e.g. floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2:
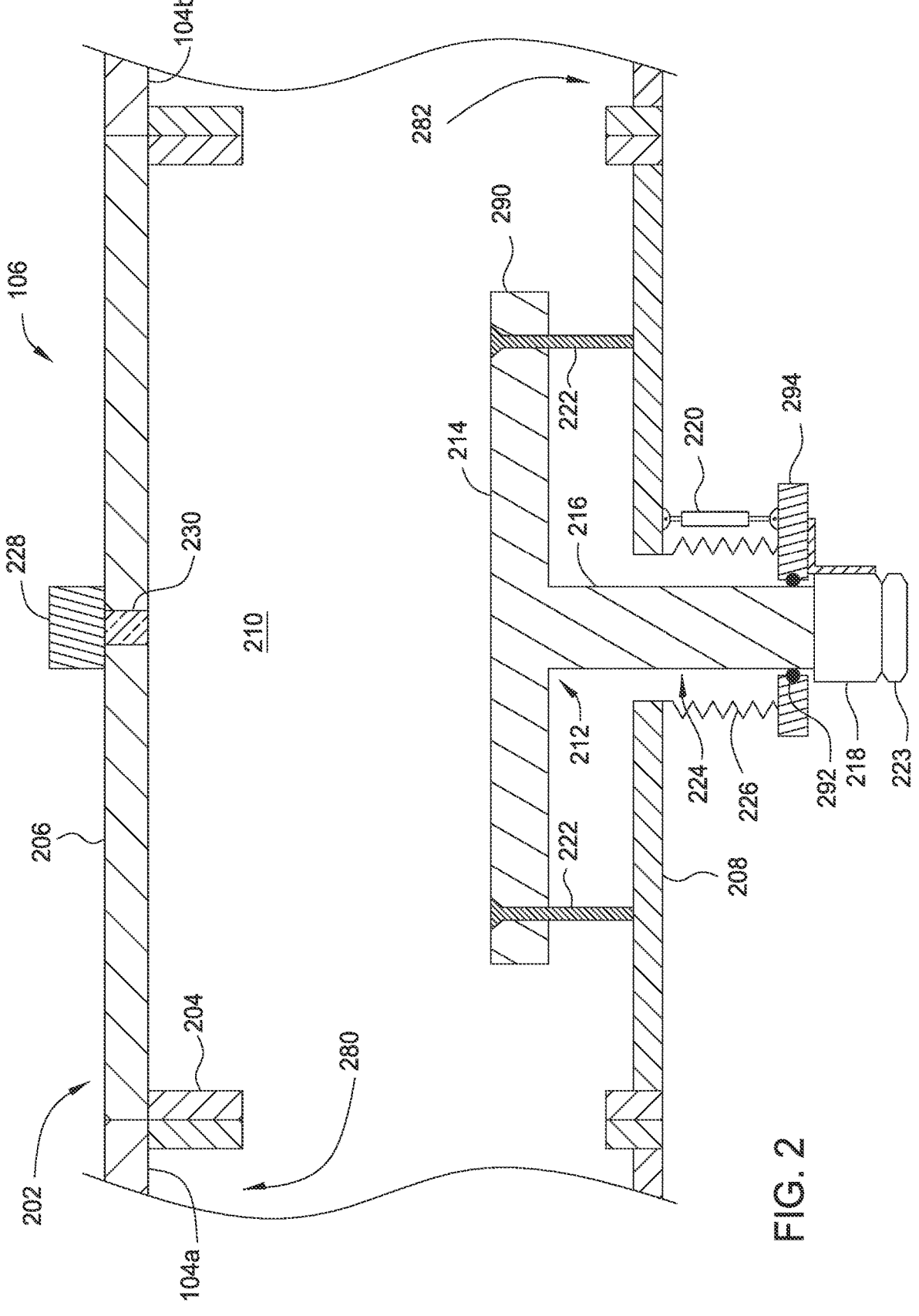
FIG. 2 illustrates a side view of the rotation module of FIG. 1 according to one embodiment.

FIG. 2 illustrates one embodiment of the rotation module 106. The rotation module 106 includes a chamber body 202 and a substrate support assembly 212. The chamber body 202 includes sidewalls 204, a ceiling 206, and a bottom 208. The sidewalls 204, the ceiling 206, and the bottom 208 define an interior volume 210. The substrate support assembly 212 is disposed in the interior volume 210. The substrate support assembly 212 includes a platform 290, a shaft 216, and a rotary actuator 218. The platform 290 has a substrate receiving surface 214 that is configured to receive a substrate. The shaft 216 extends through the bottom 208 of the chamber body 202 through an opening 224. The opening 224 is sealed by a bellows 226. A plate 294 is coupled to the bellows 226 and surrounds the shaft 216. A shaft seal 292 is a sliding seal that provides a vacuum-tight coupling between the plate 294 and the shaft 216 during actuation of the shaft. The shaft 216 is coupled to the platform 290. In one embodiment, the substrate support assembly 212 further includes a plurality of lift pins 222. The plurality of lift pins 222 are configured to extend through the substrate receiving surface 214 to raise and/or lower the substrate to facilitate robotic transfer.

The rotary actuator 218 may be a stepper motor, a servomotor, or the like. In one embodiment, the substrate support assembly 212 further includes a rotation sensor 223. The rotary actuator 218 is coupled to the shaft 216 of the substrate support assembly 212. The rotary actuator 218 may be configured to rotate the substrate support assembly 212. The rotation sensor 223 is coupled to the rotary actuator 218. The rotation sensor is configured to measure the rotation of the substrate support assembly 212. The rotation sensor 223 may be coupled to the controller (not shown) to provide real time feedback to the controller. In one embodiment, the rotation sensor 223 may be an encoder.

In one embodiment, the substrate support assembly 212 further includes a vertical actuator 220. The vertical actuator 220 is configured to move the shaft 216 vertically, in a z-direction, so that the platform 290 is raised and or lowered. In FIG. 2, the platform 290 is shown in a raised position.

A measurement device 228 is coupled to the ceiling 206 of the rotation module 106. In one embodiment, the measurement device 228 may be an ellipsometry device, configured to detect the dielectric properties of the film deposited on the substrate through a window 230 formed in the ceiling 206 of the chamber body 202. Dynamic metrology can provide a real-time feedback on the effectiveness of the rotation of the substrate on film property uniformity.

In the embodiment shown in FIG. 2, the substrate support assembly 212 is entirely within the interior volume 210 of the rotation module 106. The substrate support assembly 212 does not extend into an interior volume 280 of the first transfer chamber 104a or the interior volume 282 of the second transfer chamber 104b.

Figure 3:
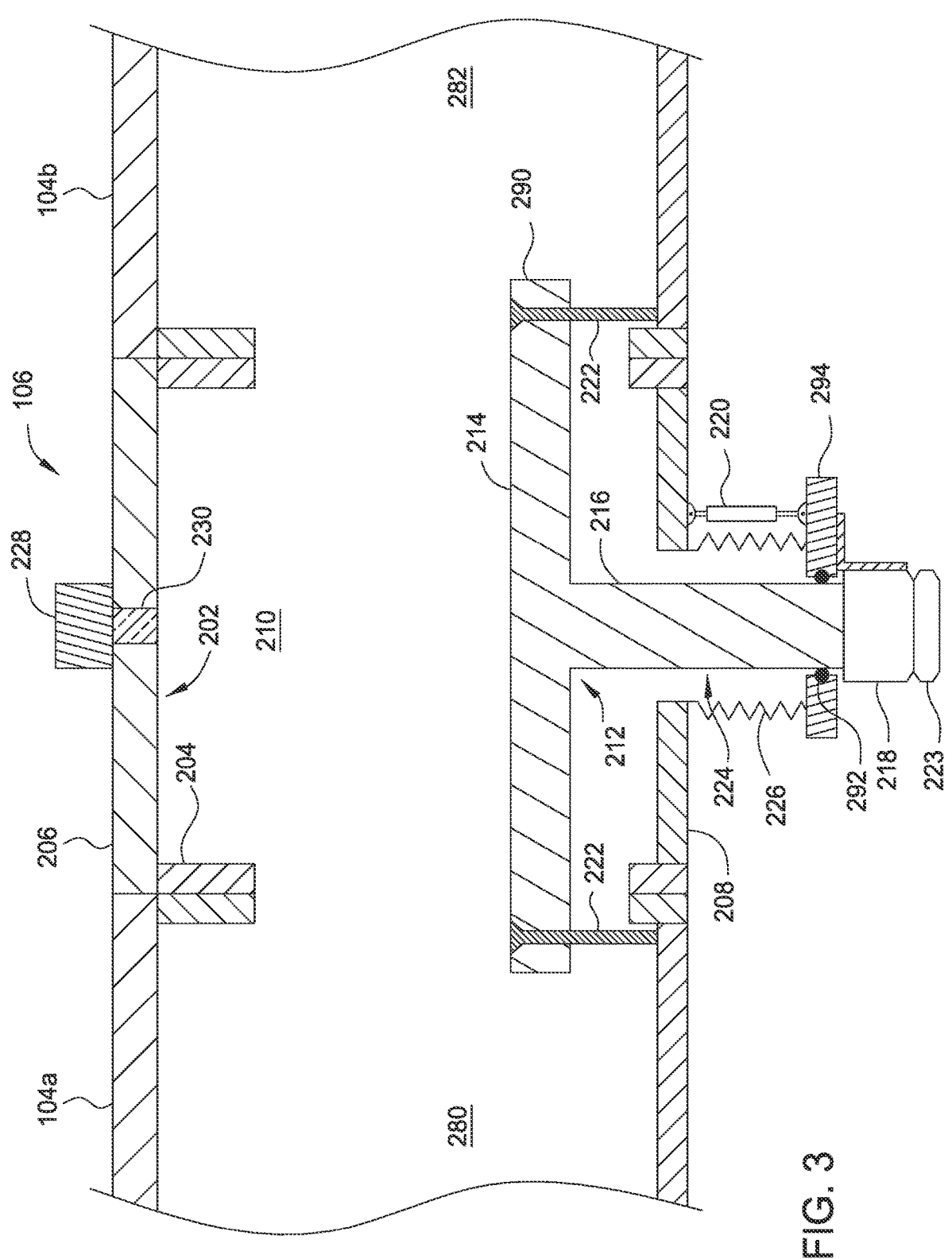
FIG. 3 illustrates a side view of another embodiment of a rotation module portion of the processing system of FIG. 1, according to one embodiment.

FIG. 3 illustrates a side view of a portion of the processing system 100 of FIG. 1, according to one embodiment. FIG. 3 includes the first transfer chamber 104a, the second transfer chamber 104b, and the rotation module 106. The rotation module 106 is coupled to both the first transfer chamber 104a and the second transfer chamber 104b. The rotation module 106 allows for fluid communication between the first transfer chamber 104a and the second transfer chamber 104b, such that the substrate can be transferred between the first transfer chamber 104a and the second transfer chamber 104b. In the embodiment shown in FIG. 3, the substrate support assembly 212 is not entirely within the interior volume 210 of the rotation module 106. Rather, the substrate support assembly 212 extends partially into the interior volume 280 of the first transfer chamber 104a and the interior volume 282 of the second transfer chamber 104b. For example, the platform 290 may extend into the transfer chambers 104a, 104b. Thus, in the embodiment shown in FIG. 3, the rotation module 106 has a smaller interior volume 210 than the interior volume 210 of the rotation module 106 shown in FIG. 2.

FIG. 4 illustrates a method 400 of processing a substrate in the processing system 100, such as that described in FIG. 1. The method 400 begins at block 402 by performing a first portion of the film deposition process on the substrate in the first processing chamber 108. The substrate is transferred to the first processing chamber 108 by the robot 114a disposed in the first transfer chamber 104a. The robot 114a is configured to move the substrate between the transfer chamber 104a and the processing chamber 108. The robot 114a transferred the substrate into the first transfer chamber 104a from the load lock chamber 110. The first processing chamber 108 may be a deposition chamber, such as a CVD chamber, a spin-on coating chamber, a flowable CVD chamber, a PVD chamber, and ALD chamber, or any other deposition chamber suitable for depositing thin films on a substrate. In the first processing chamber 108, a first portion of the film deposition process is performed on the substrate.

Figure 5A:
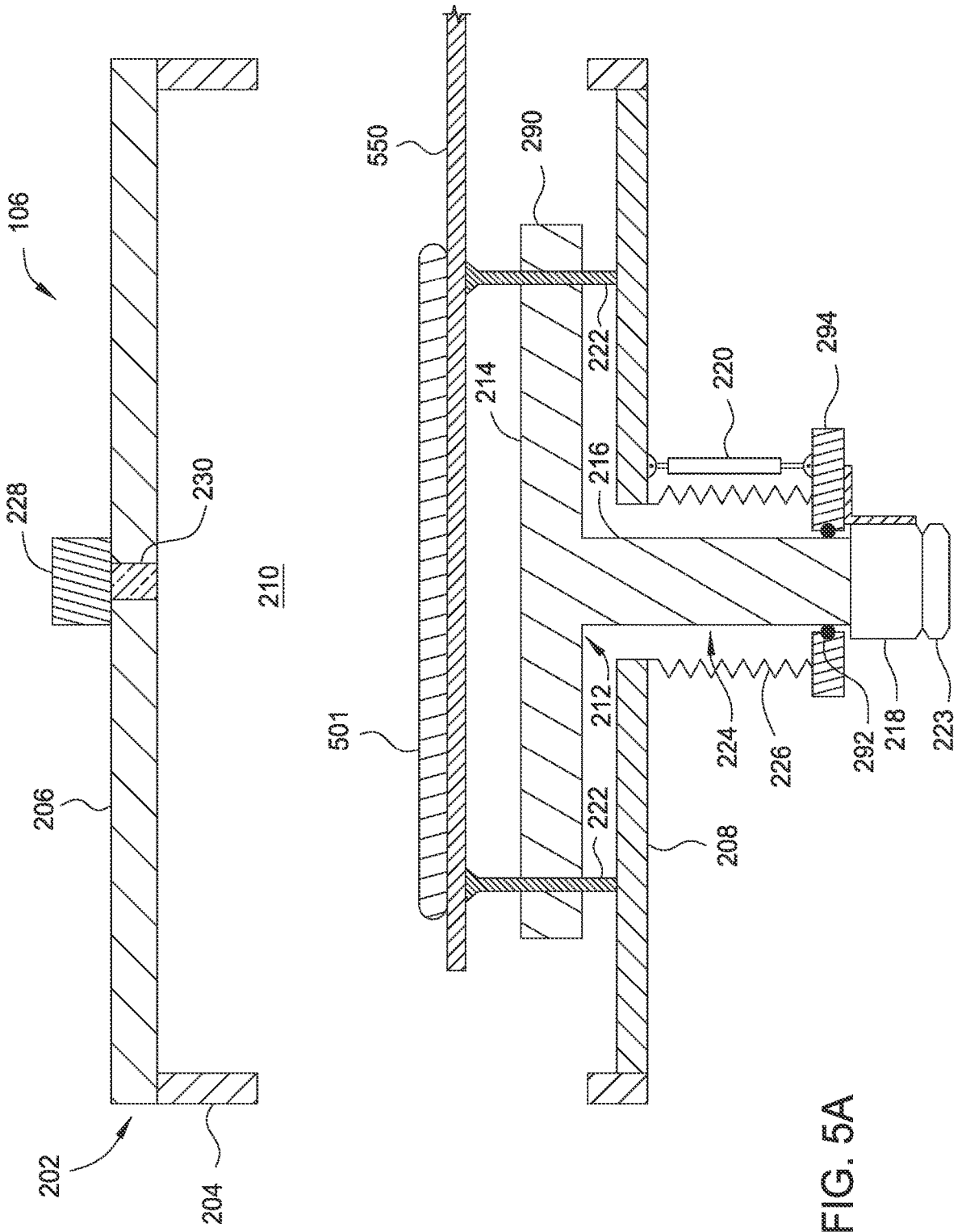
FIGS. 5A-5C illustrate a side view of the rotation module of FIG. 1, according to one embodiment, depicting how a substrate is placed on the substrate support assembly.
Figure 5B:
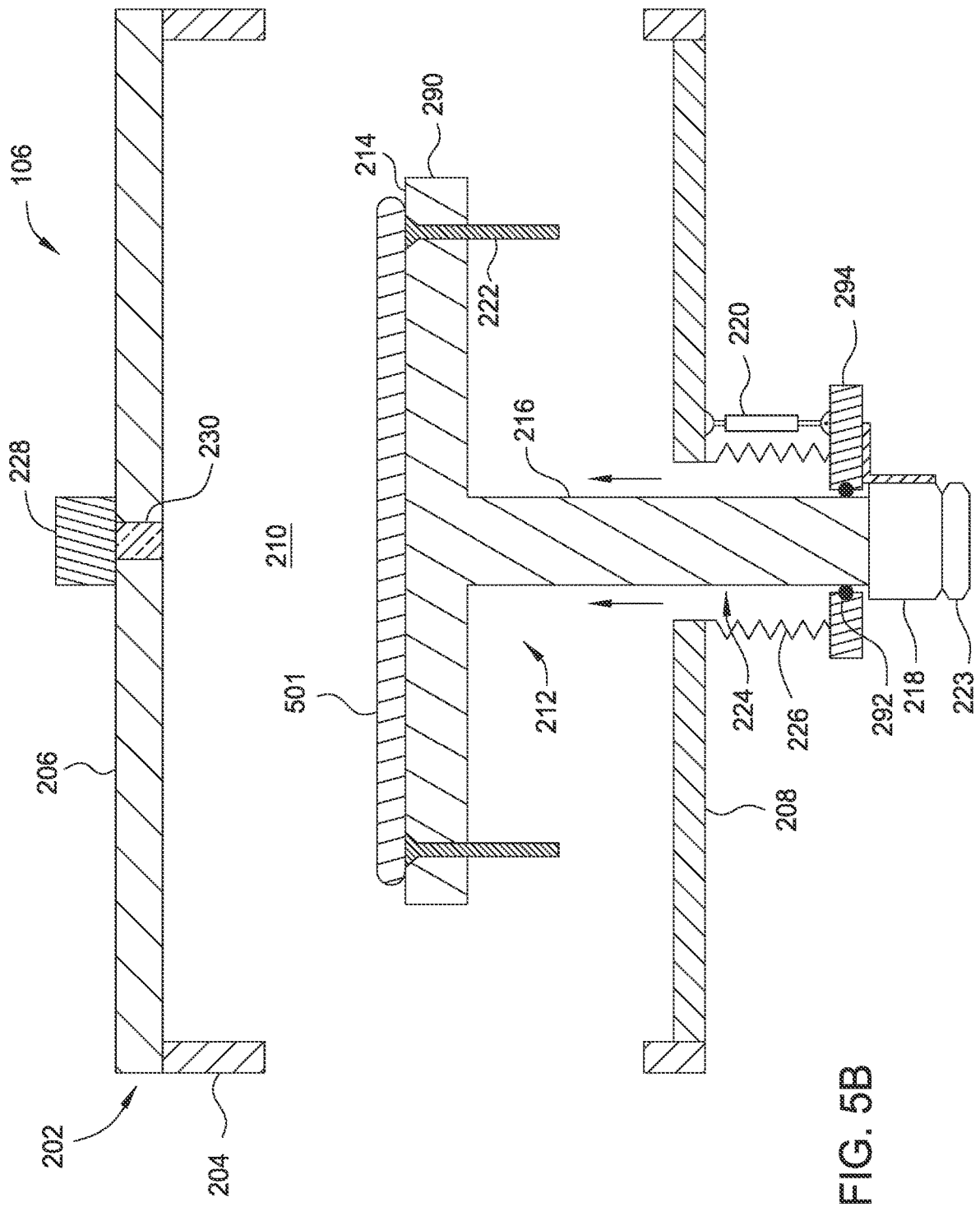

At block 404, the substrate is transferred from the first processing chamber 108 to a rotation module 106 by the robot 114a, as illustrated by FIGS. 5A-5B. FIGS. 5A-5B illustrate the rotation module 106 at block 404 of method 400. FIG. 5A illustrates the rotation module 106 as the robot is positioning a substrate 501 on the substrate support assembly 212. The vertical actuator 220 actuates the substrate support assembly 212 in a downwards z-direction to allow the robot 114a to place the substrate 501 on the substrate support assembly 212. The lift pins 222 of the substrate are formed through the platform 290 of the support assembly 212. The lift pins 222 are actuated in an upward z-direction, such that the lift pins 222 extend out above the substrate receiving surface 214, when the substrate support assembly 212 is lowered. In the lowered position, the lift pins 222 contact the bottom 208 of the chamber body 202. As a result, the lift pins 222 extend out above the substrate receiving surface 214. A robot blade 550 from the robot 114a extends from the transfer chamber 104a through an opening to position the substrate 501 in the interior volume 210. Actuating the lift pins 222 allows the substrate receiving surface 214 to receive the substrate 501 from the robot blade 550 without obstructing the passage of the robot blade 550. The lift pins 222 may actuate in a downwards z-direction to position the substrate 501 on the substrate receiving surface 214 of the platform 290, when the blade is removed from beneath the substrate 501. To actuate the lift pins 222 in a downwards z-direction, the substrate support assembly 212 is actuated in an upward z-direction, such that the lift pins 222 no longer contact the bottom 208 of the chamber body 202.

FIG. 5B illustrates the rotation module 106 having the substrate support assembly 212 elevated in an extended position. The vertical actuator 220 actuates the substrate support assembly 212 to the extended position. In the extended position, the rotary actuator 218 is configured to rotate the substrate support assembly 212 (illustrated in FIG. 5C). As illustrated, the lift pins 222 are disengaged from contact with the substrate. The substrate is now resting on the substrate receiving surface 214. In an extended position, properties of the film deposited on the substrate in the first processing chamber 108 may be measured using the measurement device 228. Measuring the properties of the film allows for a better n, m, mx bunderstanding of the film uniformity during stages of the deposition process.

Figure 5C:
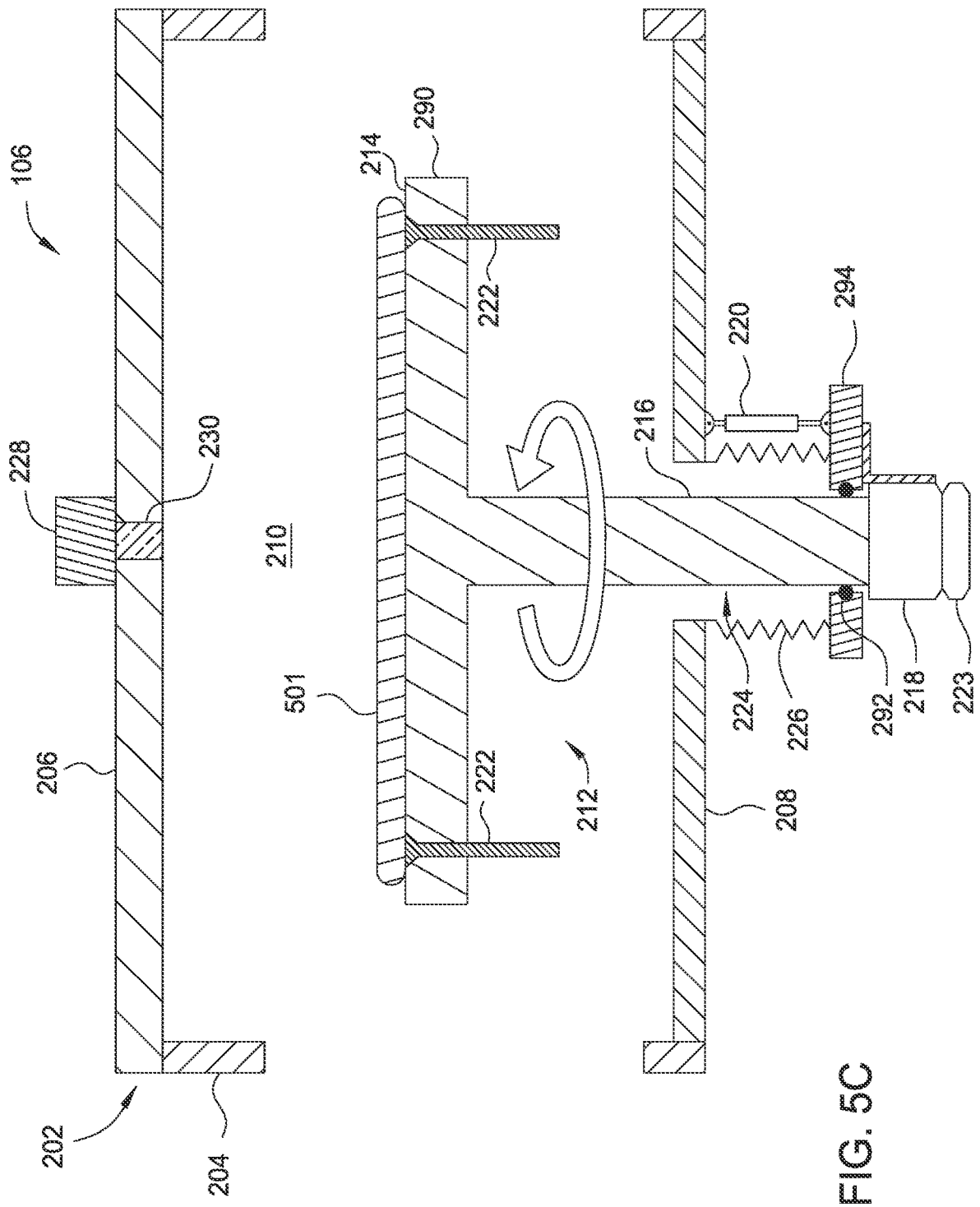

Referring back to FIG. 4, at block 406, the rotation module 106 is rotated a predefined degree, as illustrated FIG. 5C. FIG. 5C illustrates the rotation of the substrate 501 via the rotary actuator 218 as described in block 406. The rotary actuator 218 rotates the shaft 216 of the substrate support assembly 212 so that the platform 290 and the substrate 501 are rotated with the shaft 216. The rotation of the substrate 501 changes the position of the substrate 501 relative the substrate's original position. In one embodiment, the rotary actuator 218 may rotate about a central axis of the substrate 501 between about 1 and 360 degrees. For example, the rotary actuator 218 may rotate the substrate 501 between about 90 and 180 degrees. Once the substrate 501 is rotated, the processes illustrated in FIGS. 5A-5C are performed in reverse order, such that the robot 114a can remove the substrate 501 from the rotation module 106.

Continuing to refer to FIG. 4, at block 408 the substrate 501 is transferred from the rotation module 106 to the second processing chamber 108. In the second processing chamber 108 the substrate 501 undergoes a second portion of film deposition process, as illustrated by block 410. The robot 114b transfers the substrate 501 from the rotation module 106 to the second transfer chamber 104b, and then to the second processing chamber 108. The second portion of the film deposition process may be the same film deposition process as the first portion of the film deposition process. For example, the second portion of the film deposition process may be a CVD chamber, a spin-on coating chamber, a flowable CVD chamber, a PVD chamber, and ALD chamber, or any other deposition chamber suitable for depositing thin films on a substrate.

Processing of the substrate may proceed by repeating the method 400 described in FIG. 4 until a satisfactory film has been formed on the substrate. The substrate may then be removed from the processing system 100. In one embodiment, the substrate may be rotated about 90 degrees four times such that the substrate undergoes four film deposition processes and is transferred to the rotation module 106 four times. The substrate may thus be processed in the processing chambers 108 when the substrate is in four distinct orientations in the processing chamber 108. The properties of the film may also be measured four separate times using the measurement device 228 atop the rotation module 106.

Figure 6:
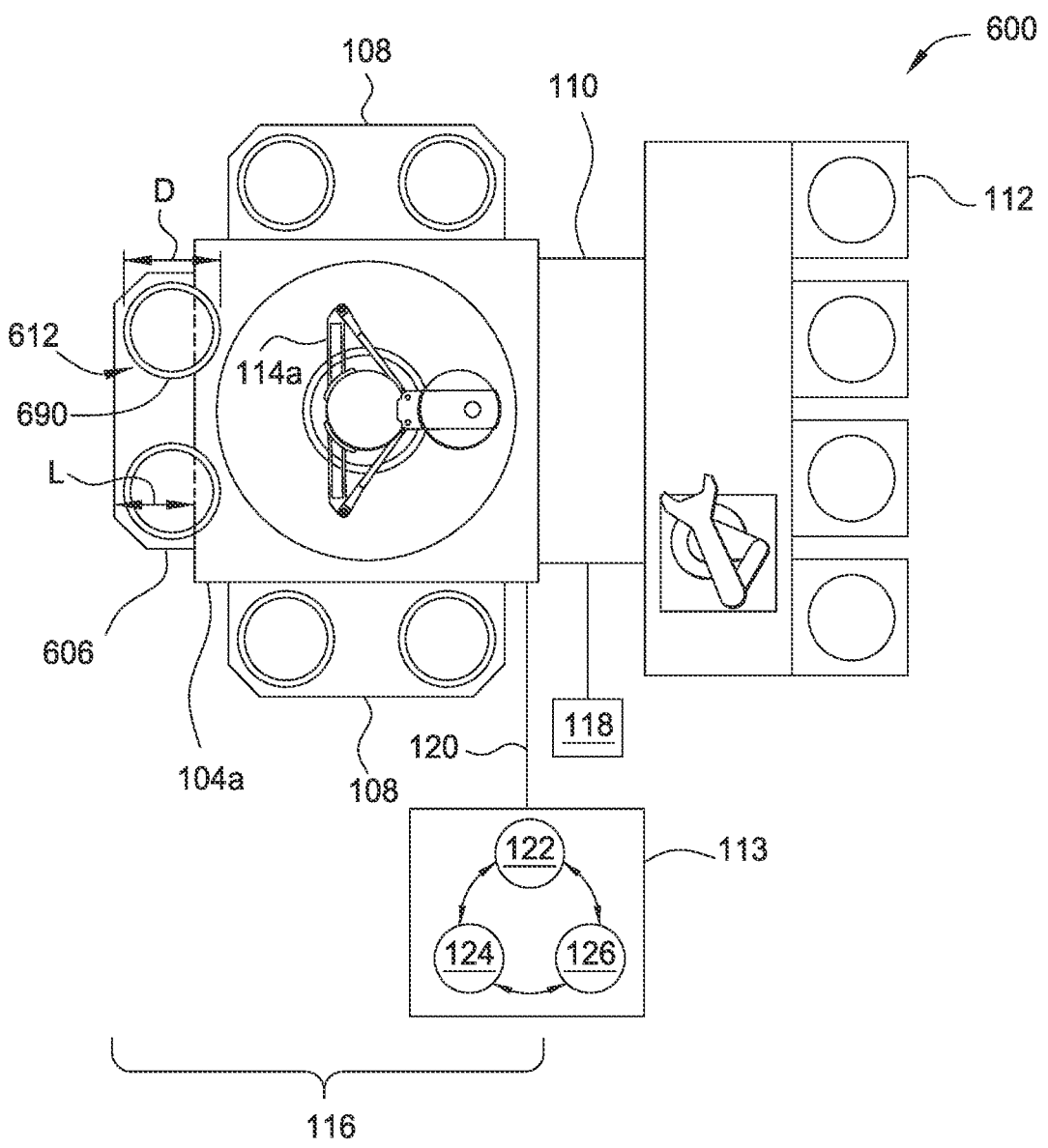
FIG. 6 illustrates a top view of a processing system having a rotation module, according to one embodiment.

FIG. 6 illustrates a processing system 600 for processing substrates, according to one embodiment. The processing system 600 is similar to the processing system 100. Accordingly, like numerals have been used to designate like components described above with reference to FIG. 1. The processing system 600 includes transfer chambers 104, a rotation module 606, and one or more processing chambers 108. The processing system 600 may also include a load lock chamber 110, a factory interface 112, and a controller 113. The one or more processing chamber 108 and the rotation module 606 are coupled to the transfer chamber 104.

The rotation module 606 is similar to the rotation module 106. Accordingly, like numerals have been used to designate like components described above with reference to FIGS. 1, 2, and 3. The rotation module 606 is in fluid communication with the transfer chamber 104. The rotation module 606 is configured to rotate a substrate. The rotation module 606 further includes a substrate support assembly 612. The substrate support assembly 612 includes a platform 690. The rotation module 606 is sized such that the rotation module 606 has a length, L, that is less than the diameter D of the platform 690. Thus, the substrate support assembly 612 extends partially into the transfer chamber 104. The length, L, of the rotation module 606 compared to the diameter D of the platform 690 has several advantages. The processing volume, V, of the rotation module 606 is decreased resulting in less time needed for pumping down the rotation module 606. Additionally, moving parts, such as a slit valve door between the transfer chamber and the rotation module are removed because the platform 690 extends into the rotation module 606.

Figure 7:
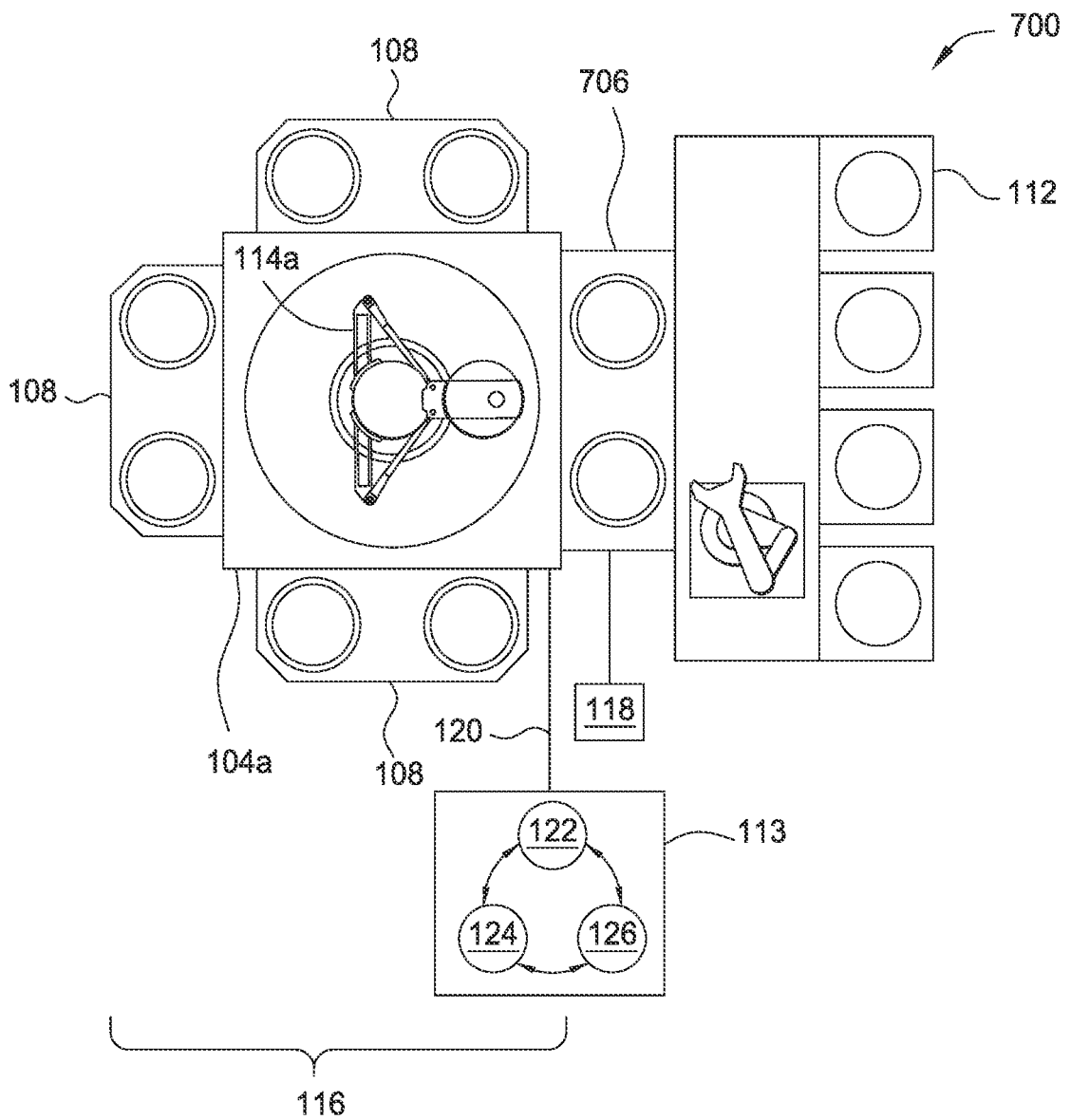
FIG. 7 illustrates a top view of a processing system having a rotation module, according to one embodiment.

FIG. 7 illustrates a processing system 700 for processing substrates, according to one embodiment. The processing system 700 is similar to the processing system 100. Accordingly, like numerals have been used to designate like components described above with reference to FIG. 1. The processing system 700 includes a transfer chamber 104, a rotation module 706, and one or more processing chambers 108. The rotation module 706 is positioned at a load lock position. The rotation module 706 is configured to rotate a substrate. The rotation module 706 and the one or more processing chamber 108 are in fluid communication with the transfer chamber 104.

While the foregoing is directed to embodiments of the present disclosure, other and further embodiments of the disclosure may be devised without departing from the basic scope thereof, and the scope thereof is determined by the claims that follow.

What is claimed is:

1. A method for processing a substrate, the method comprising:

positioning a substrate in a first orientation in a processing chamber;

performing a first process on the substrate in the processing chamber when the substrate is in the first orientation;

transferring the substrate in the first orientation from the processing chamber to a rotation module;

rotating the substrate a first predefined amount in the rotation module;

transferring the substrate from the rotation module to the processing chamber to position the substrate in a second orientation that is different than the first orientation, wherein a difference between the second orientation and the first orientation is related to the first predefined amount of rotation of the substrate in the rotation module; and performing a second process on the substrate in the processing chamber when the substrate is in the second orientation, wherein the second process is the same process as the first process, and the second process is the next process performed on the substrate after the first process.

2. The method of claim 1, wherein measurements from a rotation sensor are used to control a rotation of a substrate support in the rotation module and cause the substrate to rotate the first predefined amount in the rotation module.

3. The method of claim 1, further comprising:

transferring the substrate in the second orientation from the processing chamber to the rotation module; and performing uniformity measurements on the substrate in the rotation module after transferring the substrate in the second orientation from the processing chamber to the rotation module.

4. The method of claim 3, wherein the uniformity measurements are performed using an ellipsometer.

5. The method of claim 1, further comprising:

transferring the substrate in the second orientation from the processing chamber to the rotation module;

rotating the substrate a second predefined amount in the rotation module;

transferring the substrate from the rotation module to the processing chamber to position the substrate in a third orientation that is different than the second orientation, wherein a difference between the third orientation and the second orientation is related to the second predefined amount of rotation of the substrate in the rotation module; and performing a third process on the substrate in the processing chamber when the substrate is in the third orientation.

6. The method of claim 5, wherein the third process is the same process as the first process and the second process.

7. The method of claim 5, wherein the third orientation is different than the first orientation.

8. The method of claim 1, wherein the first process and the second process are each a deposition process.

9. A method for processing a substrate, the method comprising:

positioning a substrate in a first orientation in a first processing chamber;

performing a first process on the substrate in the first processing chamber when the substrate is in the first orientation;

transferring the substrate in the first orientation from the first processing chamber to a rotation module;

rotating the substrate a first predefined amount in the rotation module;

transferring the substrate from the rotation module to a second processing chamber to position the substrate in a second orientation that is different than the first orientation, wherein a difference between the second orientation and the first orientation is related to the first predefined amount of rotation of the substrate in the rotation module; and performing a second process on the substrate in the second processing chamber when the substrate is in the second orientation, wherein the second process is the same process as the first process, and the second process is the next process performed on the substrate after the first process.

10. The method of claim 9, wherein measurements from a rotation sensor are used to control a rotation of a substrate support in the rotation module and cause the substrate to rotate the first predefined amount in the rotation module.

11. The method of claim 9, further comprising:
transferring the substrate in the second orientation from the second processing chamber to the rotation module; and
performing uniformity measurements on the substrate in the rotation module after transferring the substrate in the second orientation from the second processing chamber to the rotation module.

12. The method of claim 11, wherein the uniformity measurements are performed using an ellipsometer.

13. The method of claim 9, further comprising:
transferring the substrate in the second orientation from the second processing chamber to the rotation module;
rotating the substrate a second predefined amount in the rotation module;
transferring the substrate from the rotation module to the first processing chamber, to the second processing chamber, or to a third processing chamber to position the substrate in a third orientation that is different than the second orientation, wherein a difference between the third orientation and the second orientation is related to the second predefined amount of rotation of the substrate in the rotation module; and
performing a third process on the substrate when the substrate is in the third orientation in the corresponding first processing chamber, second processing chamber or third processing chamber.

14. The method of claim 13, wherein the third process is the same process as the first process and the second process.

15. The method of claim 13, wherein the third orientation is different than the first orientation.

16. The method of claim 9, wherein the first process and the second process are each a deposition process.

17. A method for processing a substrate, the method comprising:
a) positioning a substrate in a first orientation in a processing chamber of one or more processing chambers;
b) performing a first process on the substrate in the processing chamber during a first time period;
c) transferring the substrate from the processing chamber to a rotation module after performing the first process;
d) rotating the substrate a predefined amount in the rotation module;
e) transferring the substrate from the rotation module to a processing chamber of one or more processing chambers during a next time period, wherein the substrate is in a different orientation in the processing chamber relative to one or previous orientations of the substrate in the one or more processing chambers;
f) performing an additional process on the substrate in the processing chamber during the next time period, wherein
the additional process is the same process as the first process, and
a first performance of the additional process is the next process performed on the substrate after the first process; and
g) transferring the substrate from the processing chamber to the rotation module after performing the additional process.

18. The method of claim 17, further comprising:
h) performing a uniformity measurement on the substrate in the rotation module after performing the additional process; and
i) repeating blocks d-h) until a satisfactory level of uniformity has been achieved.

* * * * *